(12) United States Patent　　(10) Patent No.: US 10,355,154 B1
Bayoumi　　(45) Date of Patent: Jul. 16, 2019

(54) HYBRID PHOTOVOLTAIC DEVICE AND RADIANT COOLING DEVICE, SYSTEM, METHOD AND CHILLER THEREFOR

(71) Applicant: King Abdulaziz University, Jeddah (SA)

(72) Inventor: Mohannad Bayoumi, Jeddah (SA)

(73) Assignee: King Abdulaziz University, Jeddah (SA)

( * ) Notice: Subject to any disclaimer, the term of this patent is extended or adjusted under 35 U.S.C. 154(b) by 0 days.

(21) Appl. No.: 16/003,658

(22) Filed: Jun. 8, 2018

(51) Int. Cl.
*H01L 31/052* (2014.01)
*H02S 20/23* (2014.01)
*H02S 40/42* (2014.01)
*F24S 20/63* (2018.01)

(52) U.S. Cl.
CPC .......... *H01L 31/0521* (2013.01); *F24S 20/63* (2018.05); *H02S 20/23* (2014.12); *H02S 40/425* (2014.12)

(58) Field of Classification Search
CPC .... H01L 31/0521; H01L 31/052; F24S 20/63; F24S 20/66; H02S 20/23; H02S 20/26; H02S 40/425; H02S 40/42
See application file for complete search history.

(56) References Cited

U.S. PATENT DOCUMENTS

| | | | |
|---|---|---|---|
| 3,450,192 A * | 6/1969 | Hay | F24F 5/00 126/628 |
| 3,957,109 A * | 5/1976 | Worthington | F24F 5/0046 165/48.2 |
| 4,020,827 A | 5/1977 | Broberg | |
| 4,159,708 A * | 7/1979 | Pyle | F24S 10/753 126/645 |
| 4,285,332 A * | 8/1981 | McHugh | F24D 3/005 126/632 |
| 6,148,570 A * | 11/2000 | Dinwoodie | E04D 13/17 52/173.3 |
| 6,630,622 B2 | 10/2003 | Konold | |
| 8,347,877 B2 * | 1/2013 | Shabtay | F24S 30/42 126/664 |
| 8,978,316 B2 | 3/2015 | Malpas | |
| 9,404,673 B2 | 8/2016 | Swift et al. | |
| 2010/0065044 A1 * | 3/2010 | Reader | H02S 20/23 126/676 |

FOREIGN PATENT DOCUMENTS

WO　　2005/060681 A2　　7/2005

* cited by examiner

*Primary Examiner* — Golam Mowla
(74) *Attorney, Agent, or Firm* — Oblon, McClelland, Maier & Neustadt, L.L.P.

(57) ABSTRACT

A building-integrated hybrid photovoltaic and radiant cooling device integrated into a building structure, including a chiller, a cooling device for cooling fluid supplied to a radiant cooling panel, a return pipe conveying the fluid from the radiant cooling panel to cool a photovoltaic device, and at least one supply pipe transporting the fluid from the photovoltaic device to the chiller, the cooling device reducing a surface temperature of the radiant cooling panel only to the extent necessary to also avoid condensation being formed on the radiant cooling panel, i.e. to just above the dew point.

16 Claims, 17 Drawing Sheets

HYBRID PHOTOVOLTAIC DEVICE AND RADIANT COOLING DEVICE, SYSTEM, METHOD AND CHILLER THEREFOR

BACKGROUND OF THE INVENTION

Technical Field

The present invention relates to system and method for supplying a cooling fluid to hybrid photovoltaic/thermal device in which a radiant cooling device cools both a photovoltaic device and an interior space in a building structure, and to a chiller for use therein.

Description of the Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

In order to solve the energy demand challenges facing the world many regions are utilizing renewable energy for daily energy use. Often this energy is generated or harvested at or very close to the point of use. However, compared with the conventional approach of centralized energy generation (for example by combustion of fossil fuels at a remote location), local and decentralized energy generation is essential for energy efficiency due to the reduced loss in the transportation and conversion process of energy forms. In many instances energy harvesting devices and systems are installed directly on the structures within which the energy demand occurs. Building integrated photovoltaics (BIPV) are one example of such point of use energy harvesting/generation systems that are becoming essential parts of contemporary architecture.

Generation of power from photovoltaic or photovoltaic thermal panels is becoming increasingly common. However, particularly in hot climates, the photovoltaic panels have a tendency to become overheated, and this occurs most frequently when incident sunlight is brightest, so that the power generated would otherwise be at a maximum. Unfortunately, raising the temperature of the photovoltaic panels above a certain level reduces their efficiency and thereby reduces their electrical power output.

A significant portion of energy that is absorbed by photovoltaic-cells (PV) is in the form of heat which causes a considerable increase in the surface temperature (Tc) of PV panels. This results in substantial deterioration in the efficiency of the panels and consequently their output. In hot climates, PVs are more likely to be affected by increasing Tc due to the high ambient temperatures (Ta) and the associated incident solar irradiance (G).

One method for cooling PVs is by contacting a fluid (e.g., a liquid heat transfer medium) with the PV absorber. The fluid in the pipes absorbs thermal energy from the heated-up surface. The waste heat can be used for other purposes by delivery to other points for uses such as potable water heating. This combination of two systems is called hybrid photovoltaic/thermal (PVT) technology [X. Zhang, X. Zhao, S. Smith, J. Xu, and X. Yu, "Review of R&D progress and practical application of the solar photovoltaic/thermal (PVT) technologies," Renew. Sustain. Energy Rev., vol. 16, no. 1, pp. 599-617, 2012—incorporated herein by reference]. Depending on the design, using water as refrigerant is sensible due to its higher thermal capacity. Further, the generated thermal energy can also be used for other applications such as potable water, air and room heating. Moreover, the potential of a façade integrated PVT that can be used for solar assisted cooling is discussed by Prieto et. al [A. Prieto, U. Knaack, T. Auer, and T. Klein, "SOLAR COOLFACADES Framework for the integration of solar cooling technologies in the building envelope," Energy, 2017] based on the principles of solar cooling addressed by Henning [H.-M. Henning and International Energy Agency. Solar Heating and Cooling Program, Solar-assisted air-conditioning in buildings: a handbook for planners. Wien; New York: Springer, 2004—incorporated herein by reference]. The limits of these approaches are related to the outlet temperature (Tret) of the fluid that comes out of the PVT. However, associating cooling with façade integrated energy generation is always interesting as high cooling loads occur often during times of high solar irradiation.

In a typical PVT (photovoltaic thermal) system a collector panel 1 generates electrical power to heat water in a storage tank. Conductors function to thermally connect the collector panel to a heating coil in contact with the water to be heated in the storage tank. Cold water is taken directly from the storage tank via first pipe, but an auxiliary gas heater may be used to heat the hot water dispensed via a second pipe. The outflow water temperature from the storage tank in summer would not provide a substantial cooling effect if used to remove heat from the collector panel.

Radiant cooling (RC) systems can achieve high thermal comfort, low energy demand, quiet operation and space saving. In RC systems, water pipes are attached to a radiating panel. The circulating chilled water is cools down the panel. The chilled surface extracts a great portion of the generated heat inside a room via radiation and transports it to the chilled water via conduction [K.-N. Rhee and K. W. Kim, "A 50 year review of basic and applied research in radiant heating and cooling systems for the built environment," Build. Environ., vol. 91, pp. 166-190, September 2015; and C. Stetiu, "Energy and peak power savings potential of radiant cooling systems in US commercial buildings," Energy Build., vol. 30, no. 2, pp. 127-138, June 1999]. As the specific heat capacity of water is much higher than that of air, using water for room heat extraction is 4,000 times more energy efficient. Furthermore, in hybrid cooling, the supplied and conditioned air volume is reduced to the adequate level to maintain a desired indoor air quality (IAQ). While this is called (air-water) cooling system, the conventional air condition approach is called (all-air) system. RC can be integrated in floors, ceilings, wall or any room surface. However, the surface temperature of the RC panel needs to remain above the dew point temperature of the room air to avoid condensation on the surface.

Condensation forming on the radiant cooling tubes is a significant problem. One possible solution to the condensation problem was demonstrated in Swift et al. (U.S. Pat. No. 9,404,673 B2—the disclosure of building integration is incorporated herein by reference), where the use of a glazing panel was suggested to create a gap between the photovoltaic panel and the radiant cooling panel. However, this reduced the efficiency of transferring excess heat away from the photovoltaic devices, without providing any way to regulate this process, i.e. the effect cannot be varied.

Accordingly it is one aspect of the present disclosure to provide a device, system and method that includes a combination of façade integrated RC and PVT that avoids the drawbacks and disadvantages of unwanted condensation, space demands, connectivity and installation cost that are present in conventional systems. In a particular aspect the PVT is located on the external side and the RC surface faces an interior space.

BRIEF SUMMARY OF THE INVENTION

The foregoing paragraphs have been provided by way of general introduction, and are not intended to limit the scope of the following claims. The described embodiments, together with further advantages, will be best understood by reference to the following detailed description taken in conjunction with the accompanying drawings.

In one aspect the present disclosure is directed to a hybrid photovoltaic and radiant cooling device that includes a photovoltaic panel, a radiant cooling panel, first and second cooling pipes, a chiller fluidly connected to the first or the second cooling pipes, a frame configured to separate the photovoltaic panel and the radiant cooling panel and form an enclosed space defined by the frame, the photovoltaic panel and the radiant cooling panel such that the frame surrounds the edges of the photovoltaic panel and the radiant cooling panel.

In a further embodiment the a thermal insulation layer having length and width dimensions substantially the same as the frame is present in the enclosed space between the photovoltaic panel and the radiant cooling panel, and the first cooling pipe, the second cooling pipe and the connecting pipe are present in the enclosed space.

In a further embodiment a gap is present between the thermal insulating layer and the second cooling pipe.

In a further embodiment the device includes an air compressor configured to be supplied with electrical power by the photovoltaic device.

In a further embodiment the device has at least a first and a second cooling pipes with a plurality of capillary tubes in direct contact with one of the photovoltaic panel or the a radiant cooling panel.

In a further embodiment the device is a single integrated structure.

In a further embodiment the device includes a solar thermal collector.

In a second aspect the present disclosure relates to the use of a hybrid photovoltaic and radiant cooling device to supply a cooling fluid to a radiant cooling panel; convey the fluid from the radiant cooling panel to cool a photovoltaic panel separated from the radian cooling panel by a gap along the flat surface of the panels; transport the cooling fluid from the photovoltaic panel to the chiller; and reducing a surface temperature of the radiant cooling panel only to the extent necessary to also avoid condensation being formed on the radiant cooling panel.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF THE EMBODIMENTS

Embodiments of the present disclosure will now be described more fully hereinafter with reference to the accompanying drawings, in which some, but not all embodiments of the disclosure are shown.

Figure 2:
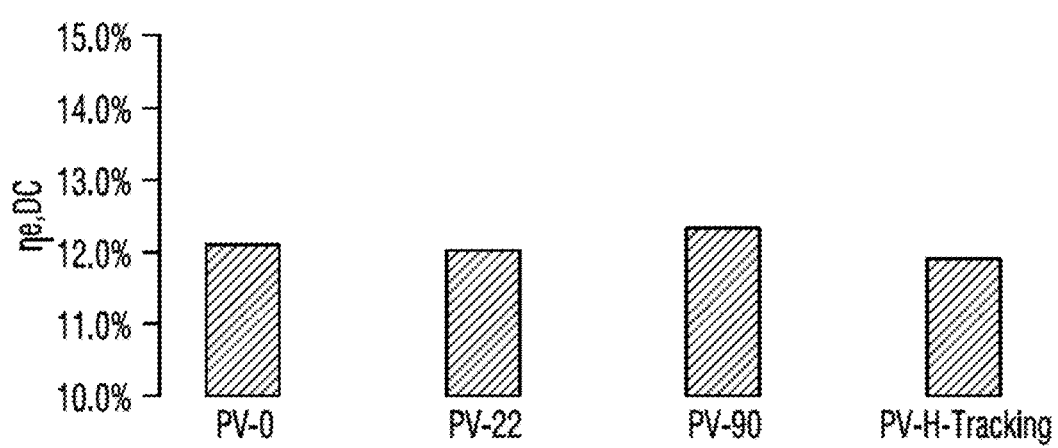
FIG. 2 shows the annual average ηe DC of different inclinations.

A non-limiting embodiment of the present invention may comprise a building integrated PVT and radiant cooling device (PVTRC), as seen in FIG. 2. Different views of the proposed PVTRC can be seen in FIG. 3-9. Such a PVTRC can be integrated into walls, inclined walls and/or roofs. It may be connected to a chiller mounted, in a non-limiting example, on the roof of the building. The chiller supplies the radiant cooling panel with a cooling fluid such as water.

In the above embodiment, radiant cooling is employed on the reverse side of the photovoltaic panels, i.e. inside the structure to be supplied with electrical power. The resulting hybrid structure is referred to as photovoltaic/thermal technology, and has at least two benefits. Not only does this reduce the temperature of the photovoltaic panels to a more efficient level, but it also cools the interior of the structure in which the panels are incorporated.

Such radiant cooling systems can be constructed using tubes carrying fluid, such as water, to conduct away the excess heat, and a cooling device referred to as a chiller may be used to cool the fluid before it is supplied to the radiant cooler.

Moreover, water heated by the photovoltaic devices can be employed for other purposes, such as for a potable water supply, as well as for air heating and heating building structures.

The present inventors have found that these limitations of Swift et al. Can be overcome by regulating the temperature of the fluid supplied by the chiller to the level needed to prevent condensation and no lower, i.e., to just above the dew point of the atmosphere.

In the device shown in FIGS. 6-13, after reducing the surface temperature of the radiant cooling panel 110, but not below the dew point of the surrounding atmosphere, cooling fluid is returned via cooling fluid return pipe 112 and connecting pipe 113 to PVT fluid supply pipe 101. This cooling fluid then flows via PV panel 100, separated from radiant cooling panel 110 by thermal insulation 114 and air gap 115, to PVT fluid return pipe 102, which returns the cooling fluid to chiller 120. Electrical power to operate chiller 120 may be obtained directly from PV panel 100. First water circulating pipes 117 are also provided on the heated side, while second water circulating pipes 118 are provided on the cooling side.

Although the above embodiment is directed to cooling an electric power generation system with the aid of an electrically driven chiller, the invention is also intended to encompass the use of thermally driven chillers.

Moreover, solar thermal collectors may be attached to the PVTRC to increase the temperature of the PVT return fluid for uses such as potable water heating and thermally driven cooling.

In the context of the present disclosure the term "building-integrated" refers to an embodiment in which the PVTRC is attached or affixed to a building or configured for this purpose. In an integrated form the PVTRC may be mounted directly into a building wall, such as a replacement for an existing window, or may be separately mounted to an exterior surface of a building wall. Such mounting may include direct contact with the exterior surface of the building wall or may be offset therefrom, preferably on a steerable device to maximize the angle of incidence with solar radiation and thereby improve energy efficiency.

In one embodiment a plurality of PVTRCs is connected in series or parallel on one more outer surfaces of a building, for example, a residence, a school, a factory or office building that may function as residential, commercial or industrial shelter.

The PVTRC is preferably a modular unit which may be fitted as a wall piece or partition to separate exterior and interior environments of a building. In this respect the PVTRC is of construction similar to a conventional window. The surface area of the outside-facing photovoltaic panel is essentially the same as the surface area of the inside-facing radiant cooling panel. As such the PVTRC can be provided in a modular form having edges which are substantially parallel to one another and may fit easily into a partition or wall opening conventionally used for housing windows or other conventional partitioning or separating units. The PVTRC is preferably constructed such that it is in a frame which houses the PV panel and radiant cooling panel as exterior and interior-facing surfaces separated internally by a thermal insulation layer that extends over the surface area of substantially the rear portion of the photovoltaic panel.

The PVTRC is preferably mounted in a frame that reflects radiant solar energy. The frame functions to hold the photovoltaic panel and the radiant cooling panel and separate them with the water circulating pipes, the thermal insulation layer and the gap. One or more supply or return points may be molded in or present on one or more edges of the frame so that the PVTRC may be directly connected or connected through one more other PVTRCs to a chiller or water storage tank. In a particularly preferred embodiment of the invention the photovoltaic panel and radiant cooling panel have a dimension that is slightly smaller than the outside dimension of the frame in which they are mounted. However the thermal insulation layer is in direct contact with each edge of the frame to thereby minimize thermal passage from interior and exterior environments of the PVTRC. In a still further embodiment the frame includes an entry or passage point for the ingress of air or a circulating gaseous material and egress of a circulating or passing gaseous material. These ingress and egress points may be used to slowly pass an inert gas or dehumidified air through one or more of the PVTRCs, individually or connected in series or connected in parallel, to further reduce the risk of condensation forming with the PVTRC module.

In another embodiment of the invention the frame of the PVTRC in modular form forms a hermetic seal for the space enclosing the water circulating pipes, the thermal insulation layer and the gap between the photovoltaic panel and the radiant cooling panel.

A liquid transfer pump may be included as a component of the PVTRC. The liquid transfer pump serves to circulate the water or heat transfer medium that functions to transfer heat from the photovoltaic panel to the radiant cooling panel. Preferably the pump is powered with electricity generated solely from the PV panel.

EXAMPLES

The functioning of the system, device and method described herein was tested to assess the temperature increase of the PV panels and its impact on modules efficiency (η, module) over one year. Tests were carried out using PolySun. Jeddah, Saudi Arabia was selected as a location for the testing. South orientation with different inclination angles were considered: 0°, 22° (optimum for Jeddah), 90° and horizontal tracking. The conditions are:

1. Typical PV panel
2. PVT Panel connected to potable water storage tank (PVTHW)
3. PVTRC The results depict the impact of Tc on the module efficiency over an entire year. The calculation of the module efficiency is according to the following equation:

$$\eta_e = \frac{G}{Q'_{e,DC}} \quad \text{(Eq. 1)}$$

where

G: irradiance on collector area (W/A Collector)

Q'e,DC: direct current produced electric energy (W)

The chosen PV modules FT245CS can be used for both PV and PVT systems. Table 1 outlines the main characteristics provided by the manufacturer FOTOTHERM. It is noted that the given module efficiency is 15.5%. However, this factor can only be achieved under the standard test conditions (STC) which among other conditions specifies a cell temperature of 25° C. and irradiance of 1000 W/m².

TABLE 1

Characteristics of Simulated PV and PVT Panels

Electrical data[1]

| | | | |
|---|---|---|---|
| Typical power | (Pn) | [Wp] | 245 |
| Open circuit voltage | (VOC) | [V] | |
| Maximum power voltage | (Vpm) | [V] | |
| Short circuit current | (Isc) | [A] | 8.74 |
| Maximum power current | (Ipm) | [A] | 8.17 |
| Module efficiency | (η) | [%] | 15.5 |
| Maximum system voltage | | [V DC] | 1000 |
| Reverse current load | (Ir) | [A] | 15 |
| Temperature coefficient - Pn | (γ) | [%/° C.] | −0.43 |
| Temperature coefficient - VPm | (β) | [%/° C.] | −0.34 |
| Temperature coefficient - Ipm | (α) | [%/° C.] | 0.065 |

Thermal data - In the case of PVT

| | | | |
|---|---|---|---|
| Aperture area | | [m$^2$] | 1.59 |
| Thermal efficiency[2] | (η$_o$) | [%] | 56 |
| Nominal thermal power[3] | | [W] | 888 |
| Volume flow rate | | [l/m] | 1.5-2.5 |
| Flow losses | | [mmH$_2$O] | 400-900 |
| Fluid volume | | [l] | 0.9 |
| Coefficient a1[2] | | [—] | 9.12 |
| Coefficient a2[2] | | [—] | 0 |
| Effective thermal capacity | | [kJ Kg$^{-1}$ K$^{-1}$] | 20 |
| IAM K0 at 50° C. | | | |

Specification

| | | | |
|---|---|---|---|
| Cells | | [—] | 60 poly-Si |
| Thickness | | [mm] | 156 |
| Electrical connectors | | [—] | MC4 |
| Hydraulic connector | | [*] | ½ female |
| Dimensions | | [mm] | 1638 × 982 × 41 |
| Weight | | [kg] | 27 |

[1]STC condition: irradiance = 1000 W/m2, cell temperature = 25° C.
[2]Based on aperture area
[3]PV OFF conditions referred to (Tm − Ta) = 0

Figure 1:
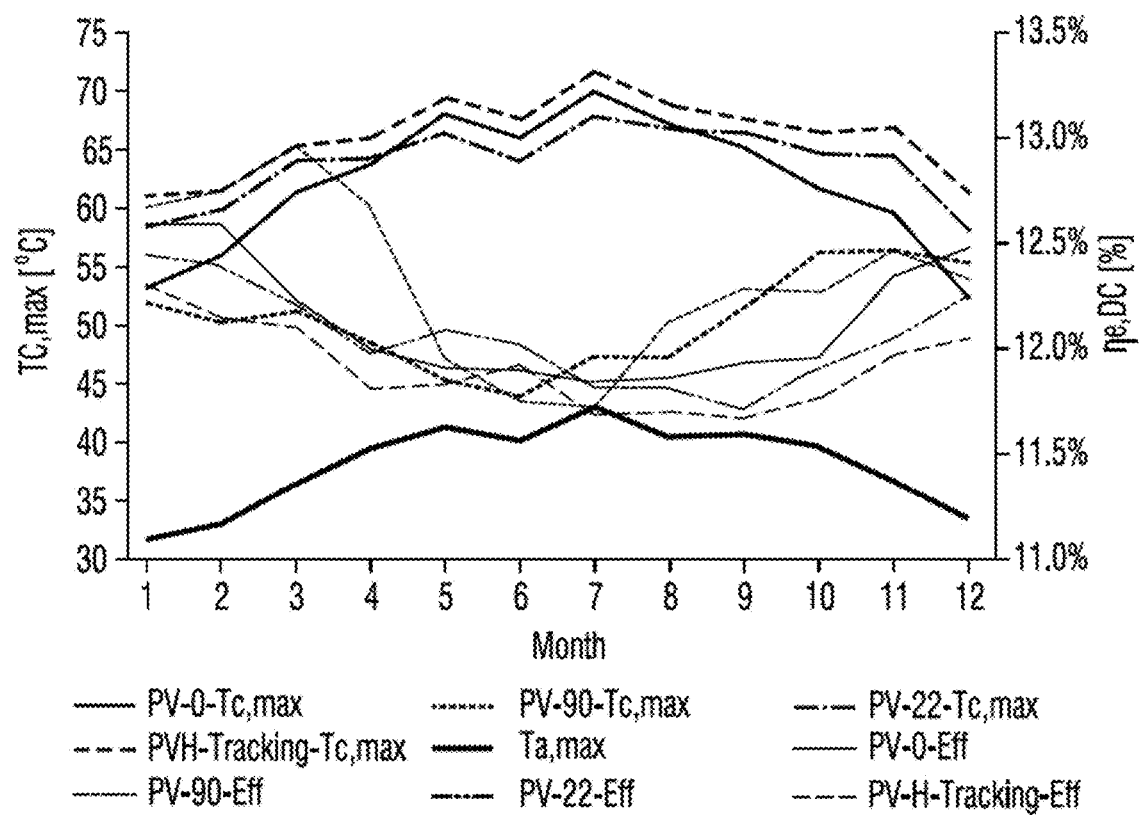
FIG. 1 Chart of maximum surface temperature (Tc, max) against module efficiency by different module inclination for a typical PV system.

Typical PV Panel:

FIG. 1 presents the course of module efficiency in relation to maximum module temperature (Tc, max) over the entire year by different inclination angles. The maximum ambient temperature (Ta,max) is indicated by a black continuous line. It can be clearly seen that in summer Tc,max reaches its maximum while ηe,DC drops to its minimum. Understandably, the module with an inclination angle (α)=90° is much less affected by the temperature increase in summer as it is less exposed to direct irradiance in summer. However, from the diagram, it can be stated that the vertical inclination towards south provides the highest ηe,DC in winter, spring and autumn. In summer, the case of α=22° demonstrates less Tc, max than the both cases of α=22° and the horizontal tracking option (H-Tracking). It generally shows better ηe,DC than H-Tracking over the entire year.

The maximum achievable ηe,DC among different inclination angles was 13% in March using a vertical module. FIG. 2 presents the annual average achievable ηe, DC for each inclination. The results indicate higher potential for south oriented vertical mounted PVs. This is particularly interesting when considering horizontal tracking which is more costly and difficult to integrate in buildings.

Figure 3:
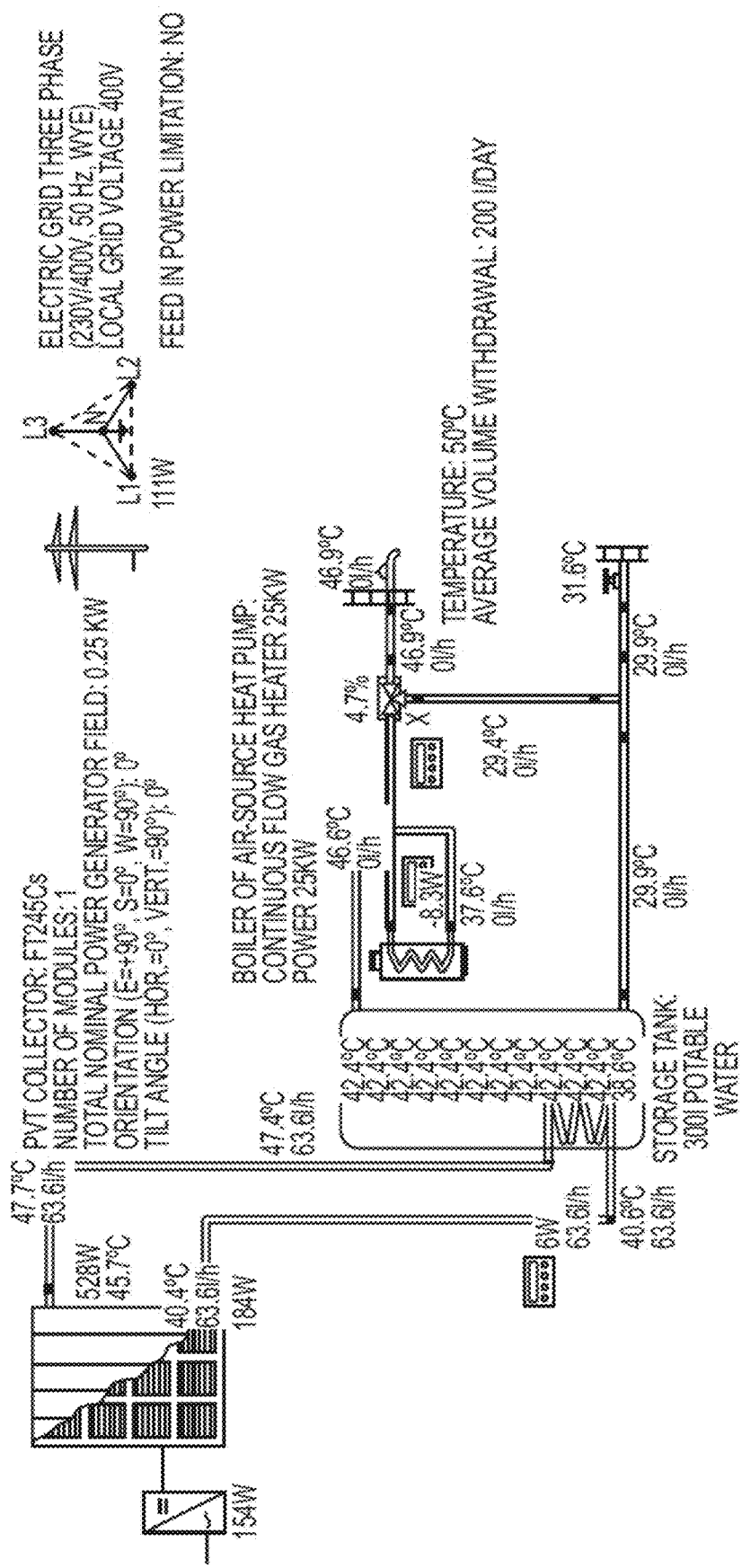
FIG. 3 shows a schematic overview of a PVT system connected to potable water storage tank and auxiliary heater.

PVT Connected to Potable Water Storage Tank:

FIG. 3 is a schematic diagram illustrating the basic system components of a PVT used for domestic water heating and supported by an auxiliary gas heater. The shown values refer to the water flow conditions of a hot day in July. According to the schematic diagram in FIG. 3, the outflow water temperature (Tout) from the water tank in summer is around 40.6° C. Therefore, it is not expected to see a substantial impact on the cooling of the PV panel.

FIG. 3 describes an aspect of the invention in which the PVT is connected to a water storage tank (3-101). The PVT (3-100) is shown with an incoming water or heat transfer medium temperature of 40.6° C. Removal of heat from the PV panel and transfer to the water or heat transfer medium forms a liquid of higher temperature (e.g., 47.7° C.). The water circulates through a water storage tank (3-101). The PVT in FIG. 3 does not include components corresponding with the radiant cooling panel that is a component of the PVTRC of the present disclosure.

Figure 4:
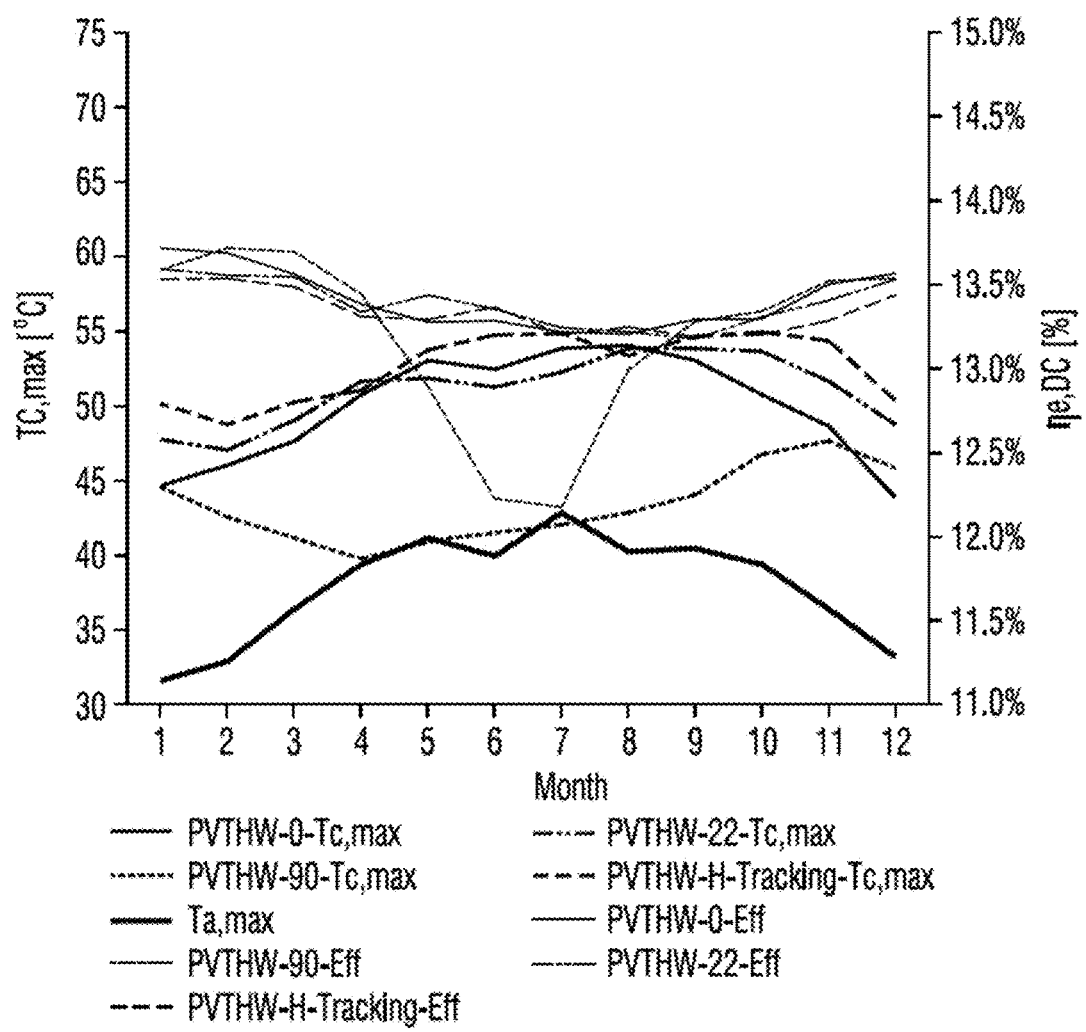
FIG. 4 shows a chart of maximum surface temperature (Tc, max) against module efficiency by different module inclination for a PVTHW used for electricity generation and domestic hot water.
Figure 5:
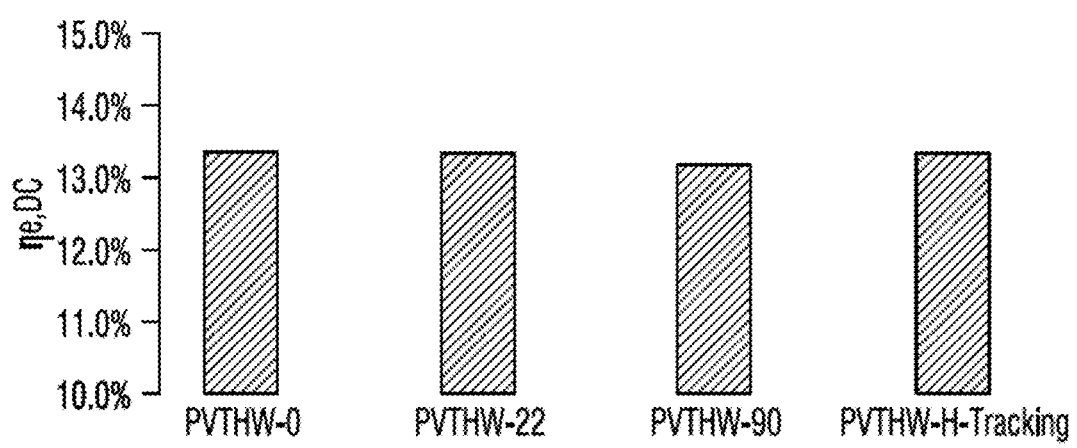
FIG. 5 shows a chart of annual average ηe DC of different inclinations using PVTHW.

A considerable decrease in Tc, max can be seen in FIG. 4. From FIG. 5, it is noted that the ηe, DC of a PVTHW exceeds 13% for the four cases and reaches an annual average of 13.3%. No significant difference among the various inclination angles could be seen. Except for the vertical module that reached slightly less annual ηe, DC. Apparently, the effect of irradiance has a greater impact on ηe, DC in the simulated cases than Ta. The elimination of the effect of Ta is caused by the supplied cooler temperature.

Figure 6:
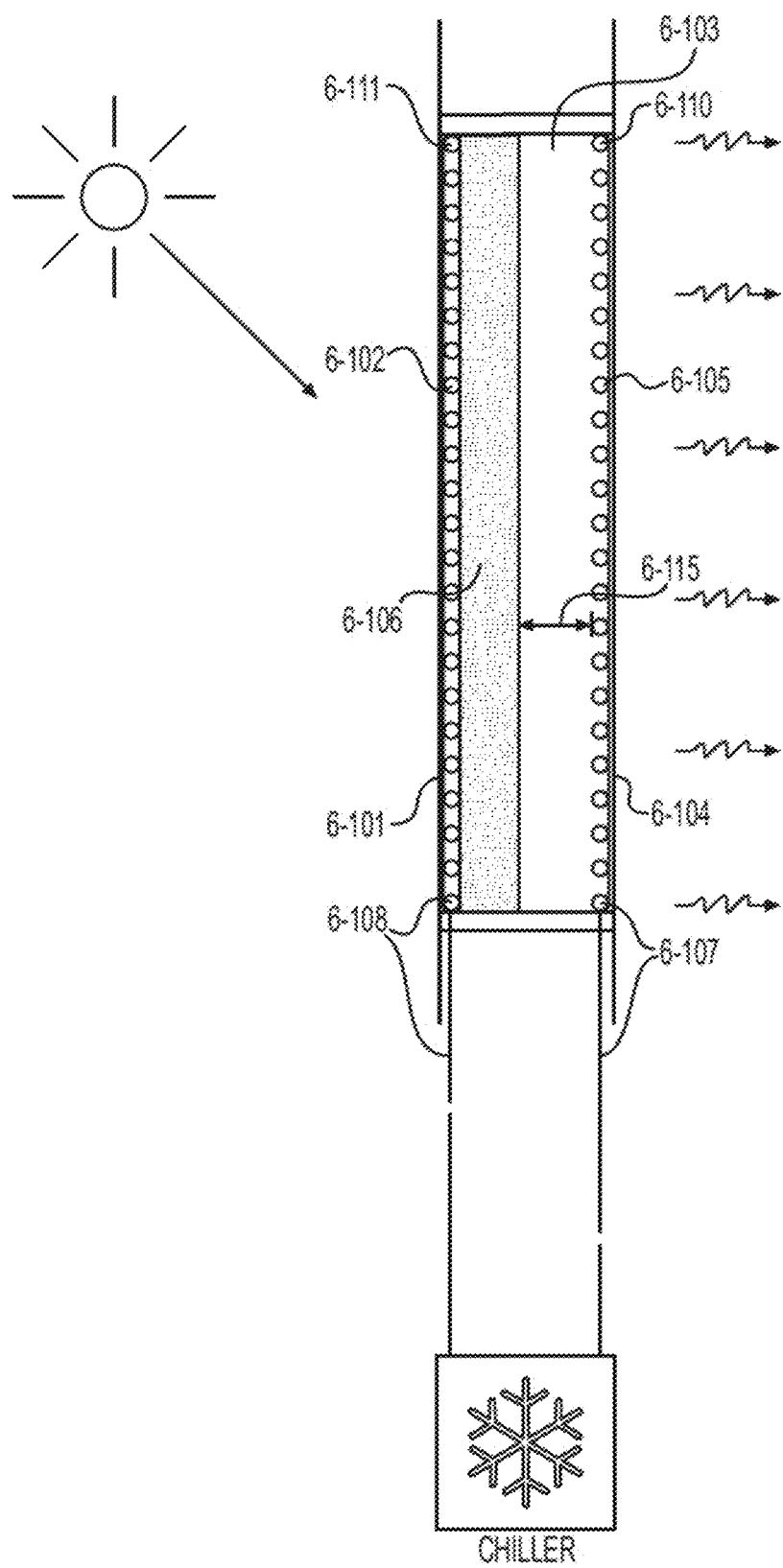
FIG. 6 is shows an illustration of basic system components of an embodiment of the invention.

PVTRC:

FIG. 6 depicts the components of an embodiment of the invention that includes a wall integrated PVT and radiant cooling device (PVTRC). Different views of the components of the PVTRC can be seen in FIGS. 7-13. Moreover, this building-integrated PVTRC can also be incorporated into roofs or inclined walls. The device is connected to a chiller (6-120) that is located on the roof of the building for instance. The chiller is the radiant cooling panel with chilled water. After reducing the surface temperature of the radiant cooling panel to the required amount for cooling (that also avoids condensation) (Tc, RC), the return water from the pipes at the back of the RC panel is used as supply water for the PVT and helps cool the PV panel and is transported to the chiller that reduces its temperature to the required level to operate the RC surface. The required amount of electricity for the operation of the chiller can be directly obtained from the PVT panel (6-101). The back of the PVT is covered by thermal insulation. An air gap separates the RC panel from the PVT.

As in other embodiments described herein, FIG. 6 describes the PV panel (6-101) on an exterior surface of a building such that it may generate electricity from solar radiation. Excess heat is removed from the PV panel (6-101) by the water circulating pipes (6-102) which are connected by the connecting pipe (6-103) to the water circulating pipes (6-105) on the radiant cooling panel portion of the PVTRC. The gap between the thermal insulation (6-106) which separates water circulating pipes (6-102) and (6-105) is shown as (6-115). In the embodiment described in FIG. 6, the gap is filled with air; however other materials such as nitrogen gas or other inert gaseous materials may fill this gap.

In some embodiments the PVTRC is limited to cooling energy generation with the aid of electrical driven chiller further. Other embodiments permit the utilization of thermally driven chillers. Still further embodiments include on or more solar thermal collectors attached to the PVTRC to increase the temperature of the PVT return water (PVTWR) to reach a desired level for a specific use like potable water heating or thermally driven cooling.

Figure 7:
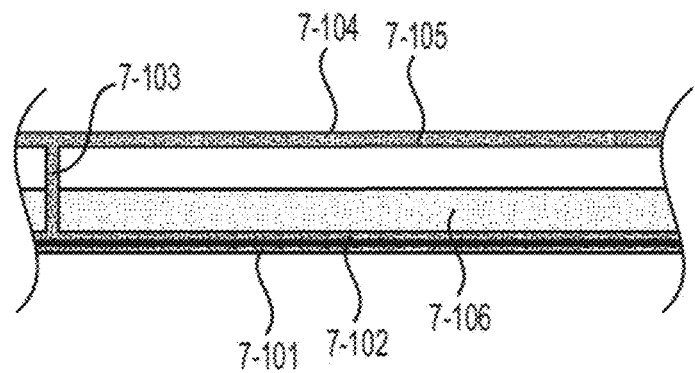
FIG. 7 shows an illustration of basic system components of an embodiment of the invention.

FIG. 7 shows a top view of the PVTRC (7-100). An outside-facing surface (7-101) represents a photovoltaic panel that covers or is exposed on an outside surface of a building into or onto which the PVTRC is integrated. The photovoltaic panel may be of any size but is preferably on the order of from 0.1-10 meters in height and 0.5-10 meters in length, preferably 0.5-9 meters in length or height, preferably 1-5 meters in length or height, preferably 3-4 meters in length or height, preferably 4-7 meters in length or height. The photovoltaic panel is preferably a single unit that may be integrated with one or more photovoltaic panels to provide a surface covering or surface attachment to an exterior building surface covering a large area, for example, a building surface area of 10 m$^2$, 100 m$^2$, preferably 200 m$^2$, preferably about 500 m$^2$, preferably about 1,000 m$^2$ or preferably about 2,000 m$^2$. The PVTRC (7-100) is in direct contact with one or more circulating pipes or membranes that is mounted onto the back of the photovoltaic panel. The circulating pipe (7-102) may be a single pipe, for example, a pipe that is coiled or follows the contour of the back of the photovoltaic panel or may be a membrane that covers a substantial surface area of the back portion of the PV panel (for example, a membrane that covers about 50%, about 60%, about 70% or about 80% of the back surface of the PV panel). The pipe or membrane (7-102) is connected to a connecting pipe (7-103) that provides fluid circulation between the water circulating pipe (7-102) and one or more water circulating pipes (7-105) present on an interior portion of the building structure. One or more connecting pipes (7-103) may be present with one or more connecting pipes providing fluid flow into the water circulating pipes (7-105) and one or more connecting pipes providing return flow from the water circulating pipe (7-105) to the water circulating pipes (7-102). Optionally, one or more pumping or fluid transfer devices may be present in or connected to the water circulating pipes (7-102) or (7-105) or the connecting pipe (7-103). In other embodiments the water or fluid present in the water circulating pipes and connecting pipes is a heat transfer medium other than water. In still further embodiments fluid transfer between connecting pipes and water circulating pipes is accomplished through convective motion or thermal expansion/contraction without any mechanical pumping. The water circulating pipes (7-105) located on an interior portion of the building are in direct contact with one or more radiant cooling panels (7-104). The radiant cooling panels may alternately be located on an exterior of the building onto which the PVTRC is integrated and remotely connected to a chiller. As shown in FIG. 7 the PV panel (7-101) and the radiant cooling panel (7-104) are separated by a thermal insulation layer (7-106). The thermal insulation layer may be any material that functions as a divider or boundary between interior and exterior (inside and outside) environments of a building onto which the PVTRC is integrated. In embodiments the insulation layer (7-106) may be of any thickness.

Figure 8:
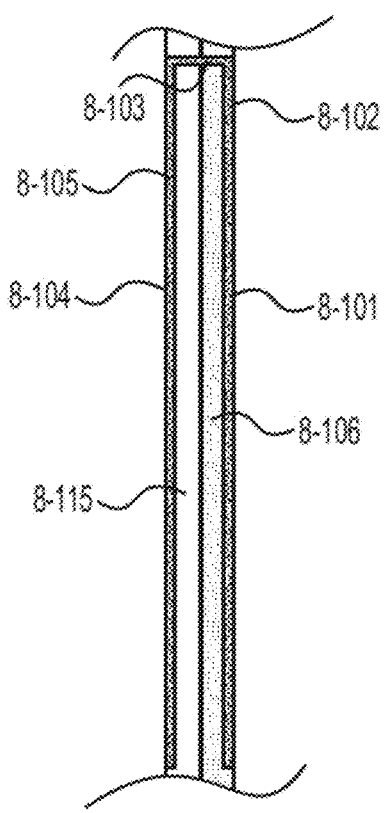
FIG. 8 shows an illustration of basic system components of an embodiment of the invention.

FIG. 8 shows a side view of the PVTRC portion of the building-integrated PVTRC showing a gap between the water circulating pipe (8-105) and the thermal insulation layer (8-106). The gap may be of various dimensions. Preferably the gap (8-115) represents an area between the thermal insulation (8-106) and the most interior facing surface of the water connecting pipes (8-105). This gap is preferably less than the thickness of the insulation layer (8-106), preferably 0.8, 0.6, 0.5, 0.25 or 0.1 times the thickness of the thermal insulation layer (8-106). In the embodiment shown in FIG. 8 the connecting pipe (8-103) is shown to be at the top. However the connecting pipe may also or alternately be located at a lower portion of this component of the PVTRC.

Figure 9:
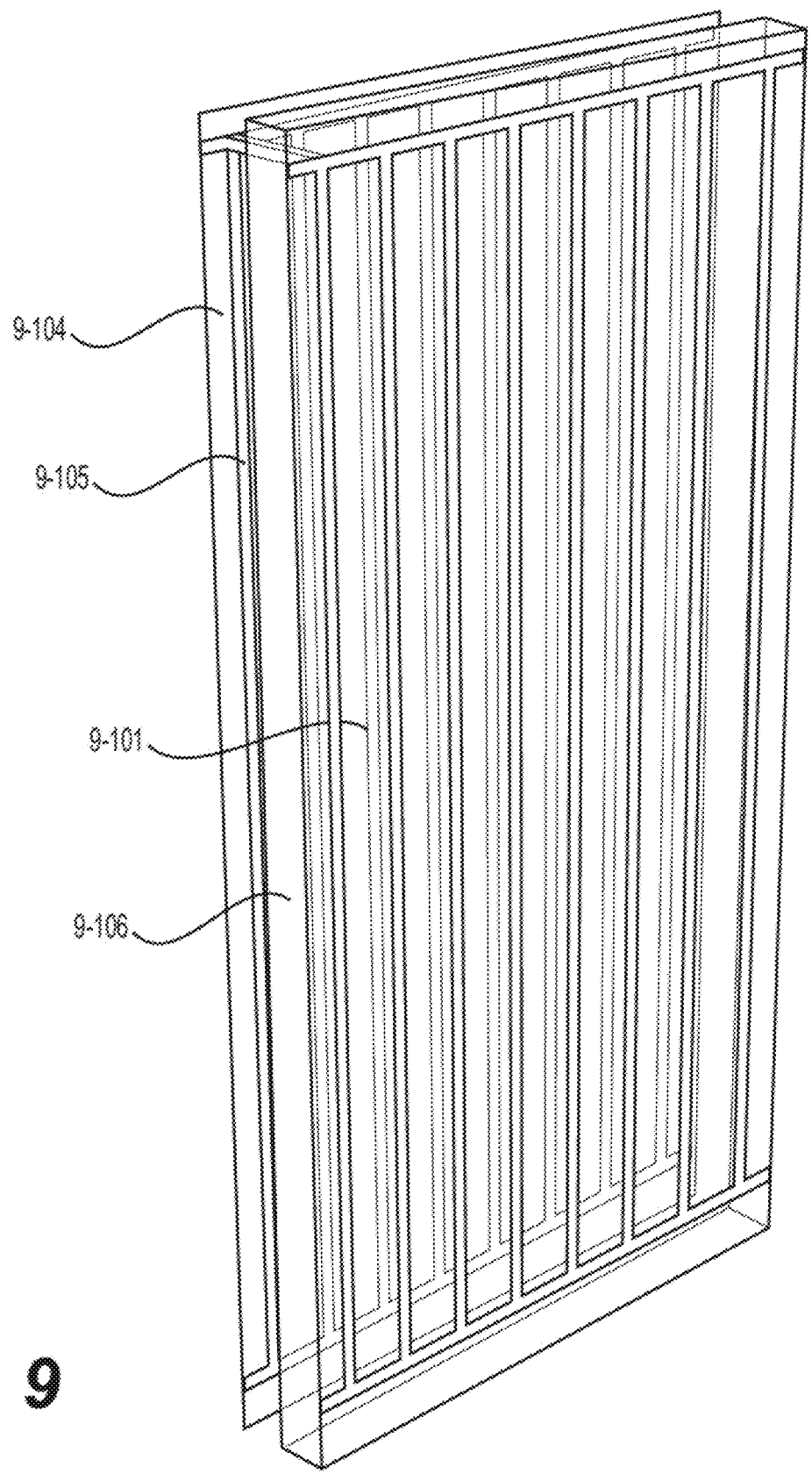
FIG. 9 shows an illustration of basic system components of an embodiment of the invention.
Figure 10:
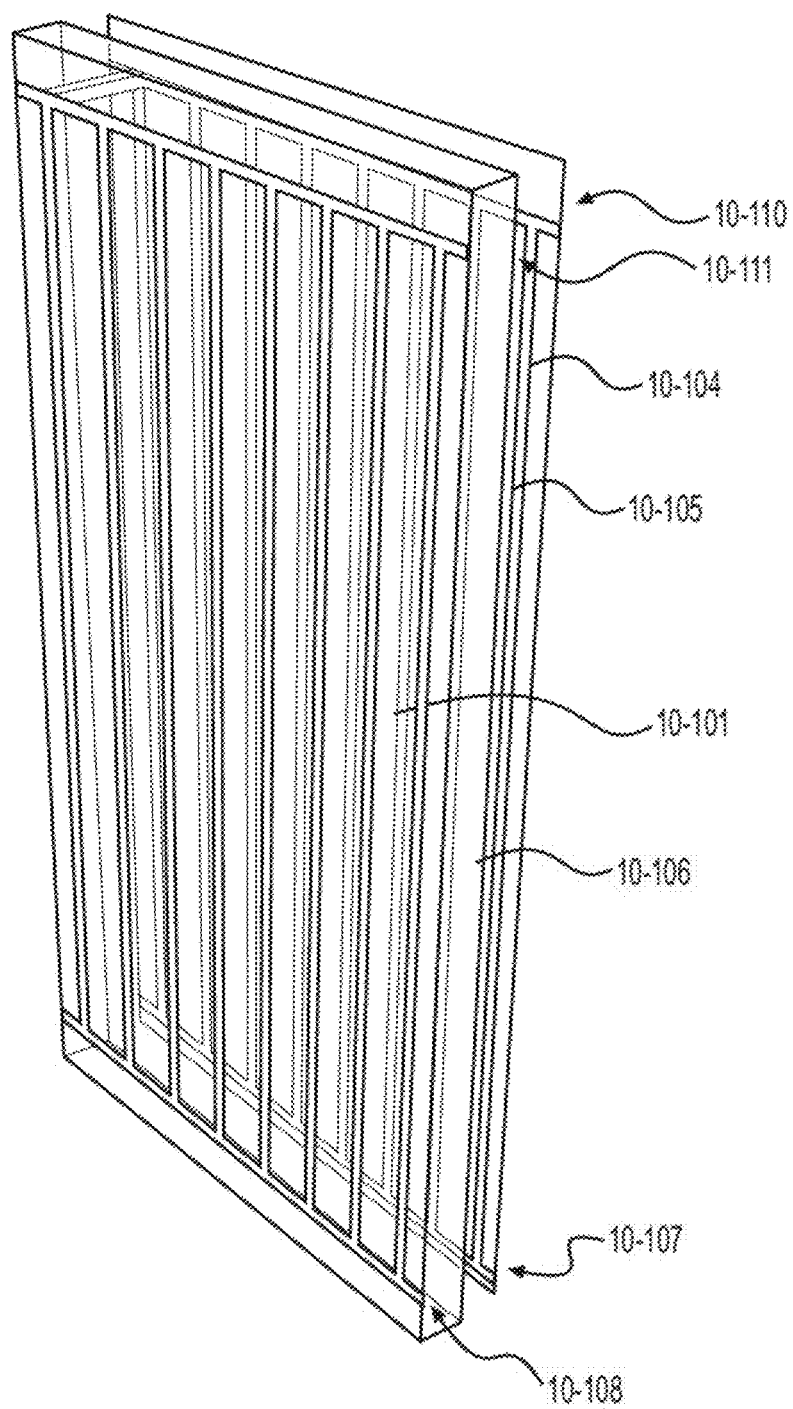
FIG. 10 shows an illustration of basic system components of an embodiment of the invention.

FIG. 9 shows a three-dimensional perspective of the PVTRC. The exterior or outside-facing surface of the PVTRC is shown as the front face (9-101). Subsequent layers of the PVTRC are shown as the thermal insulation layer (9-106), the interior connecting pipes (9-105) and the interior-facing radiant cooling panel (9-104). A further three-dimensional view of the PVTRC is shown as FIG. 10. Again the PV layer is shown as the front facing exterior layer (10-101). FIG. 10 also shows an entry point (10-107) for a cooling water supply and a water return (10-108). The cooling supply and water return may be located at alternate ends of the PVTRC or one may be located at the top and the other at the bottom of the PVTRC. Preferably the water return is connected to the connecting pipes (10-105) and the cooled water supply (10-107) is connected to the water circulating pipes in direct contact with the radiant cooling panel (10-105) and (10-104).

Figure 11:
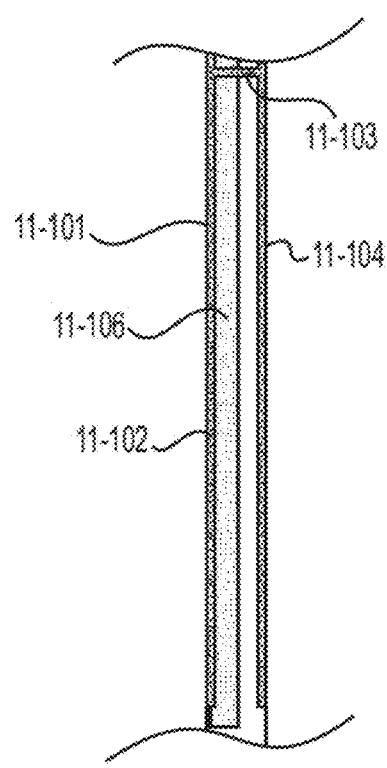
FIG. 11 shows an illustration of basic system components of an embodiment of the invention.

FIG. 11 shows a side view of an edge of the PVTRC opposite the edge of the side view shown in FIG. 8. The side view or edge view shown in FIG. 11 includes the connecting pipe (11-103) which fluidly connects the water circulating pipes in direct contact with the PV panel (11-101) and the radiant cooling panel (11-104). As noted herein, one or more additional connecting pipes (11-103) may be present in the PVTRC. Alternately the connecting pipe (11-103) may be located at a bottom or lower portion of the PVTRC (11 100).

Figure 12:
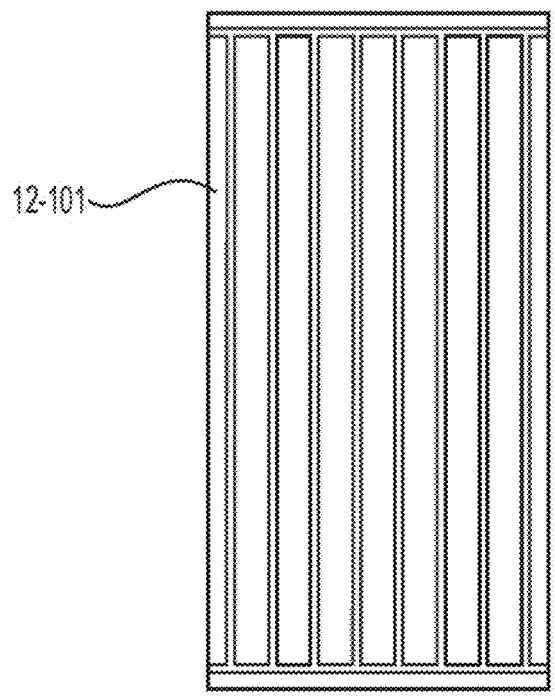
FIG. 12 shows an illustration of basic system components of an embodiment of the invention.

FIG. 12 shows a front view of the external or outside-facing surface of the PVTRC. The external side is a PV panel that may be oriented for ideal exposure to the sun to thereby maximize energy output. One or more mounting devices or steerage devices may be at least partially affixed to the front or outside portion of the photovoltaic panel (12-101).

Figure 13:
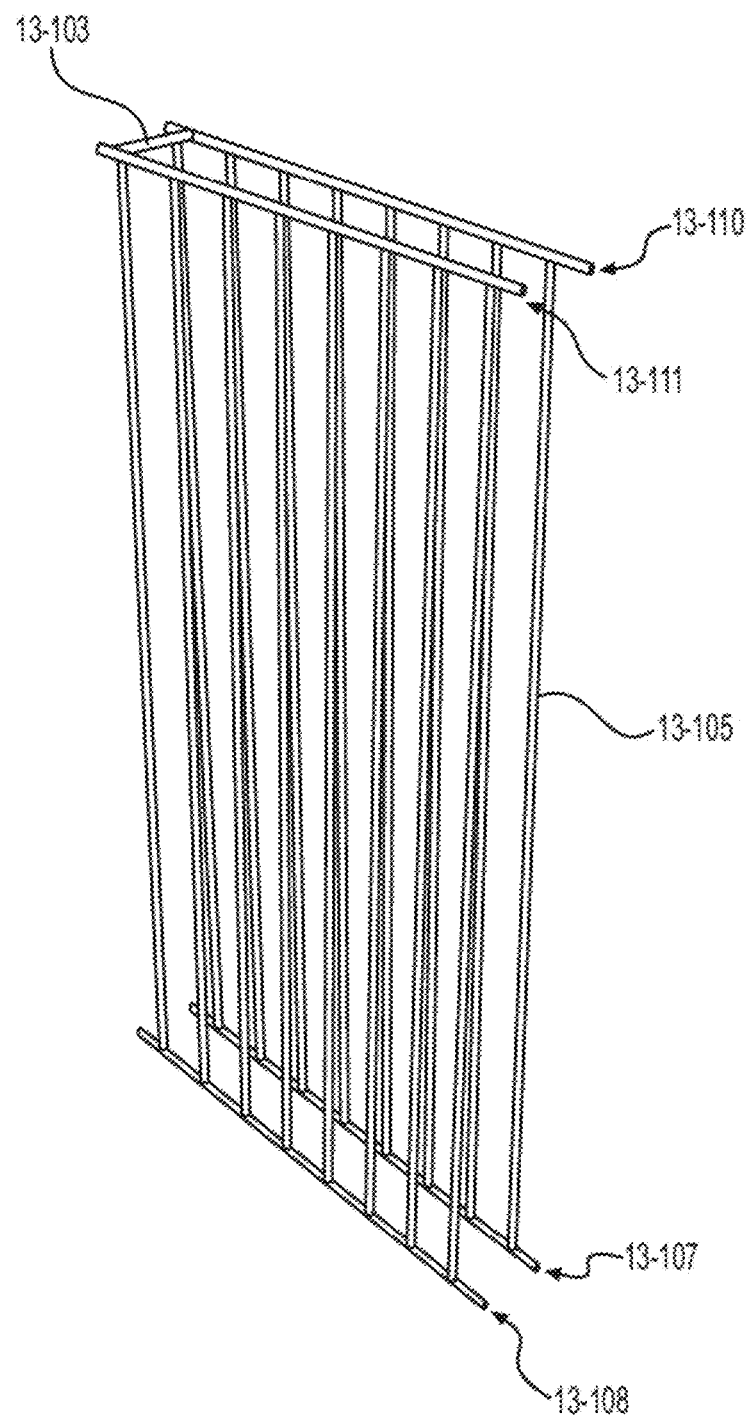
FIG. 13 shows an illustration of basic system components of an embodiment of the invention.

FIG. 13 is a description of one embodiment of the water circulating and connecting pipes of the PVTRC. In this embodiment a series of connecting pipes are connected in series or parallel on sides corresponding to the photovoltaic panel (13-101) side or the radiant cooling panel (13-104) side of the PVTRC. Preferably the water or heat transfer medium passing through the water circulating and water connecting pipes undergoes a circuitous route to maximize heat transfer from an outside-facing portion of the PVTRC, e.g., to an inside-facing portion thereof. FIG. 13 further describes a cooling water return (13-110) and a PVT water supply (13-111).

Figure 14:
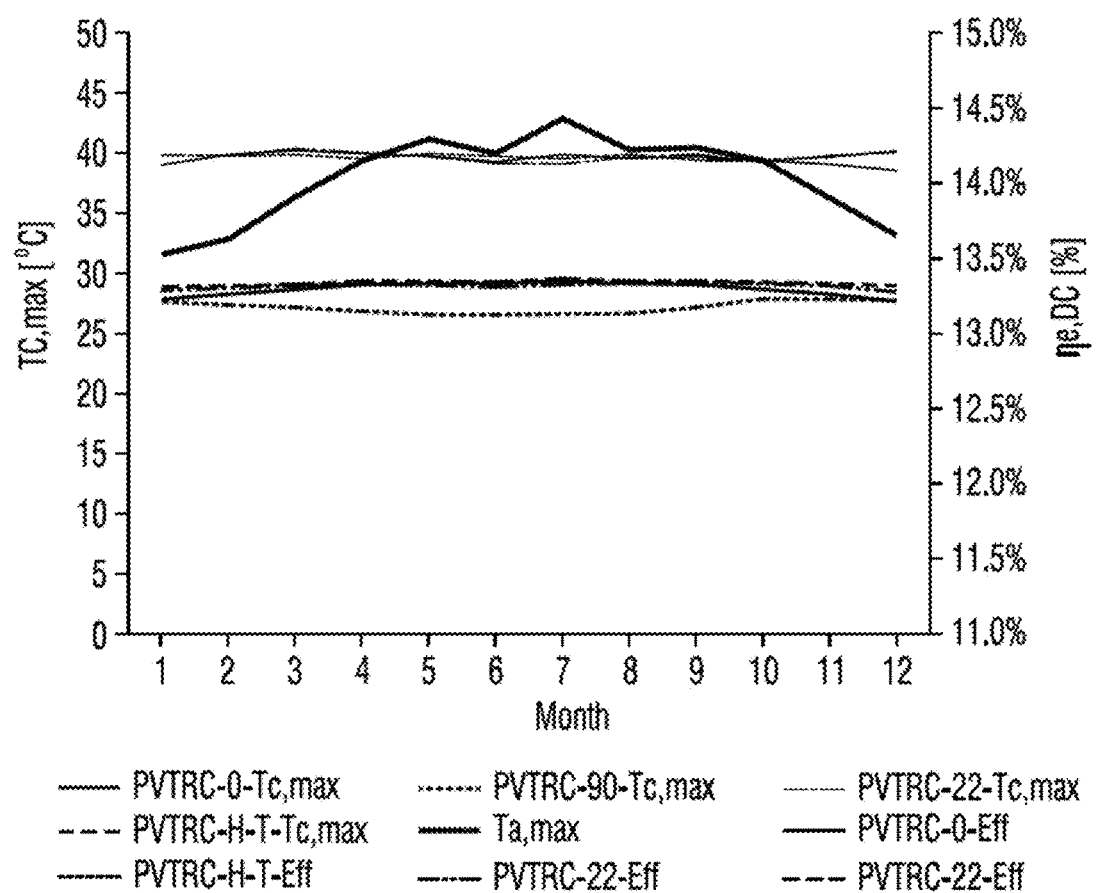
FIG. 14 shows a chart of the maximum surface temperature (Tc, max) against module efficiency by different module inclination for a PVTRC.
Figure 15:
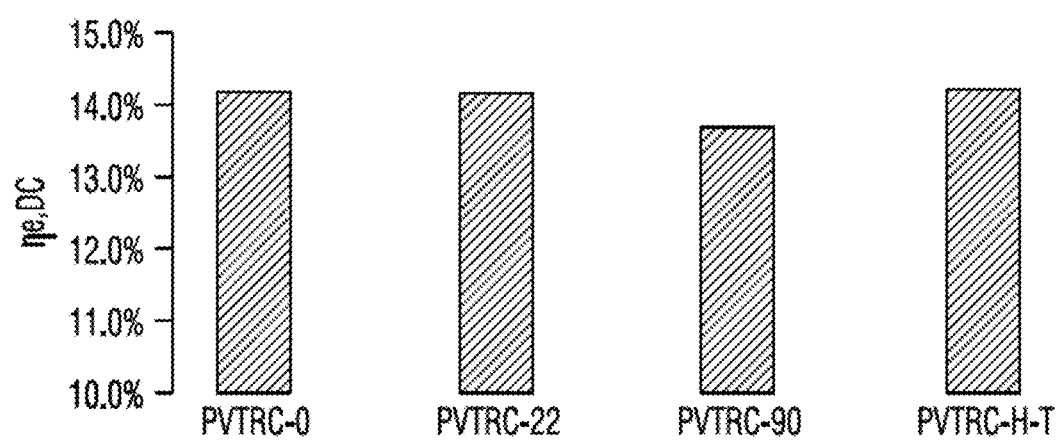
FIG. 15 shows a chart of the annual average ηe DC of different inclinations using PVTRC.
Figure 16:
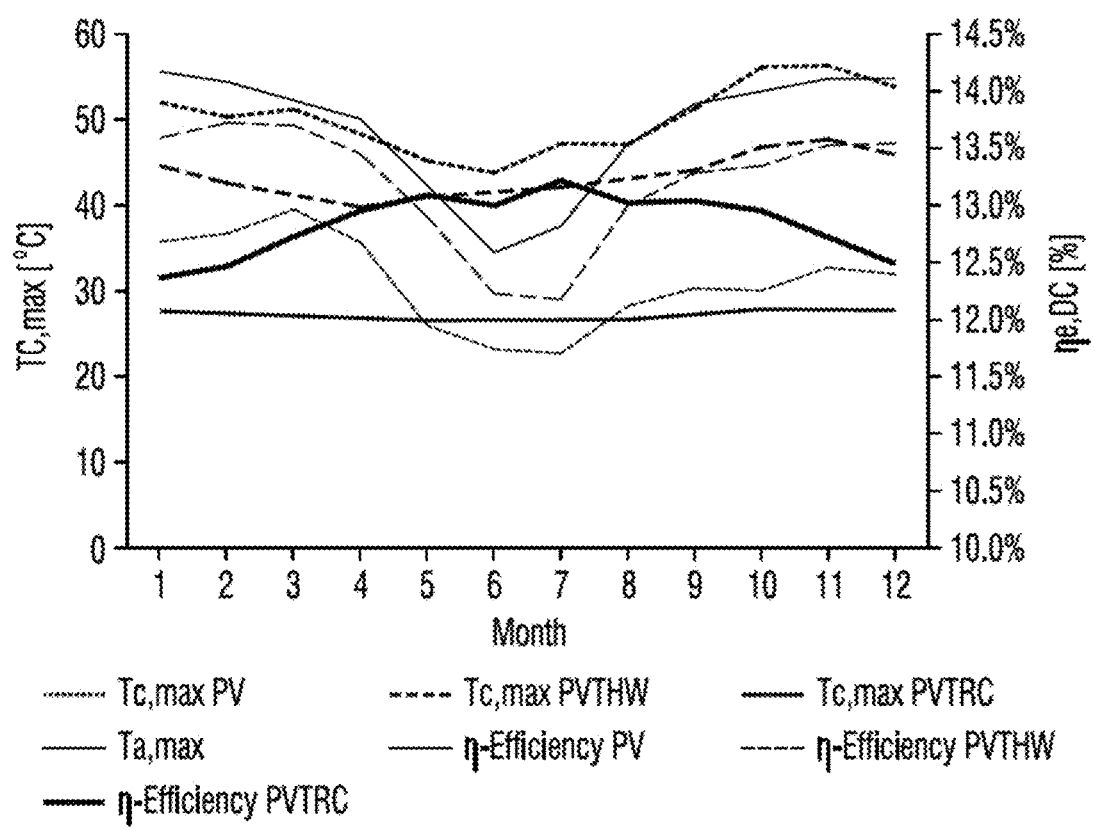
FIG. 16 shows a cross comparison of the three cases.

FIG. 14 presents the impact of lower water supply temperature (Tsup) on the Tc, max and thus ηe, DC of the PVT. The radiant cooling panel will provide a return temperature (Tret) of 25° C. which is given in the shown simulation as Tsup. Lower temperatures will have better effects. It can be clearly noted that the Tc, max over the four inclinations is between 20-30° C. Furthermore, the reduction of module temperature provides potential for building integration as it reduces the heat transfer to other building components and the interior of the building. The impacts of irradiance and Ta are substantially eliminated. An average ηe, DC of 14.1% could also be achieved.

Steady state CFD simulations using Ansys Fluent were conducted to demonstrate the temperature distribution on the panel by changing Ta and G. Table 2 outlines the material properties of the simulated PVTRC. The considered mass flow rate of water is 0.025 kg/s.

TABLE 2

Material properties of the PVTRC.

| PV-Absorber | | |
|---|---|---|
| Density | [kg/m$^3$] | 2330 |
| Cp (Specific heat) | [J/kg · K] | 700 |
| Thermal conductivity | [W/m · K] | 131 |

TABLE 2-continued

Material properties of the PVTRC.

Copper

| | | |
|---|---|---|
| Density | [kg/m³] | 8978 |
| Cp (Specific heat) | [J/kg · K] | 381 |
| Thermal conductivity | [W/m · K] | 387.6 |

Water

| | | |
|---|---|---|
| Density | [kg/m³] | 998.2 |
| Cp (Specific heat) | [J/kg · K] | 4182 |
| Thermal conductivity | [W/m · K] | 0.6 |
| Viscocity | [kg/m · s] | 0.001003 |

Insulation

| | | |
|---|---|---|
| Density | [kg/m³] | 200 |
| Cp (Specific heat) | [J/kg · K] | 1000 |
| Thermal conductivity | [W/m · K] | 0.035 |

Aluminum

| | | |
|---|---|---|
| Density | [kg/m³] | 2719 |
| Cp (Specific heat) | [J/kg · K] | 871 |
| Thermal conductivity | [W/m · K] | 202.04 |

Air

| | | |
|---|---|---|
| Density | [kg/m³] | 1.225 |
| Cp (Specific heat) | [J/kg · K] | 1006.43 |
| Thermal conductivity | [W/m · K] | 0.0242 |
| Viscocity | [kg/m · s] | 1.79E−05 |

Climate conditions of three different scenarios were considered: STC, winter and summer. The used input data for each scenario are shown in Table 3. The selected data refer to the climate condition of the standpoint: Jeddah, Saudi Arabia. However, the PVTRC device can be used in other locations.

TABLE 3

Climate scenarios tested.

STC

| | | |
|---|---|---|
| Ta | [° C.] | 25 |
| G | [W/m²] | 1000 |

Winter

| | | |
|---|---|---|
| Ta | [° C.] | 32 |
| G | [W/m²] | 261 |

Summer

| | | |
|---|---|---|
| Ta, max | [° C.] | 41 |
| Gmax | [W/m²] | 67 |

Figure 17:
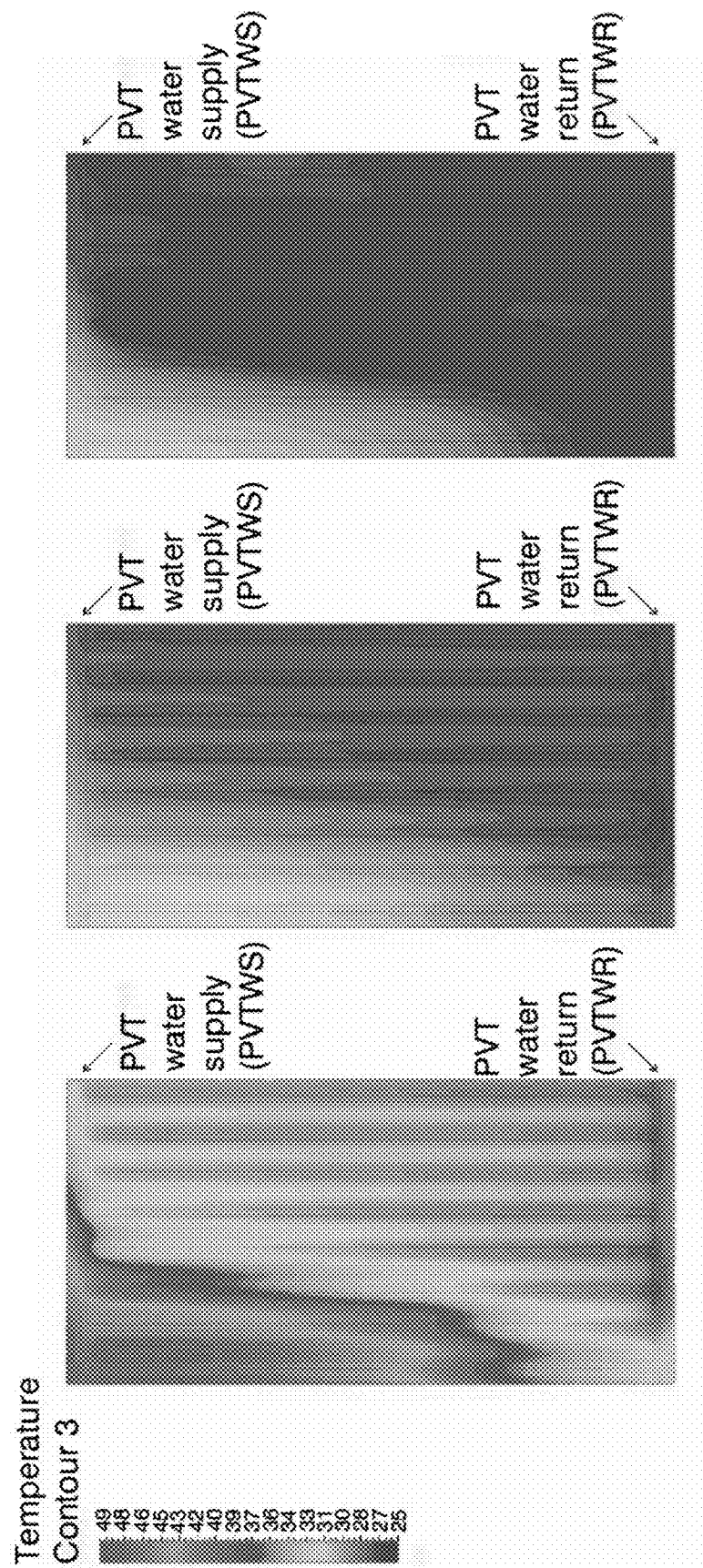
FIG. 17 illustrates the temperature distribution on the external side of the PVTRC.

FIG. 17 illustrates the temperature distribution on the external side of the PVTRC under different scenarios. The three images from left to right represent STC, winter and summer conditions respectively. Across the three conditions, it is remarkable that no even distribution of temperature on the panel surface is achieved. The top left corner demonstrates higher temperature than the rest of the panel. This is related to the characteristic of water flow, gravity and input/output locations.

Under the STC condition, despite the low Ta of 25 there is a remarkable increase in temperature distribution. The main cause is the increased irradiance of 1000 W/m2. However, significant decrease in temperature is noted due to the circulating water at the back supplied at a temperature of 25° C. Clearly, the surface temperature of a large portion of the panel is around 31° C. The image in the middle represents the winter scenario where the altitude of the sun is low. The south façade is usually affected with high irradiance that reaches 261 W/m2. This value as well as the maximum ambient temperature in winter of Ta=32° C. was used in the simulation. In summer, 67 W/m2 and 41° C. were considered in the input parameter. In both scenarios, considerable reduction in the module temperature has achieved and surface temperature between 25-30° C. is demonstrated.

Figure 18:
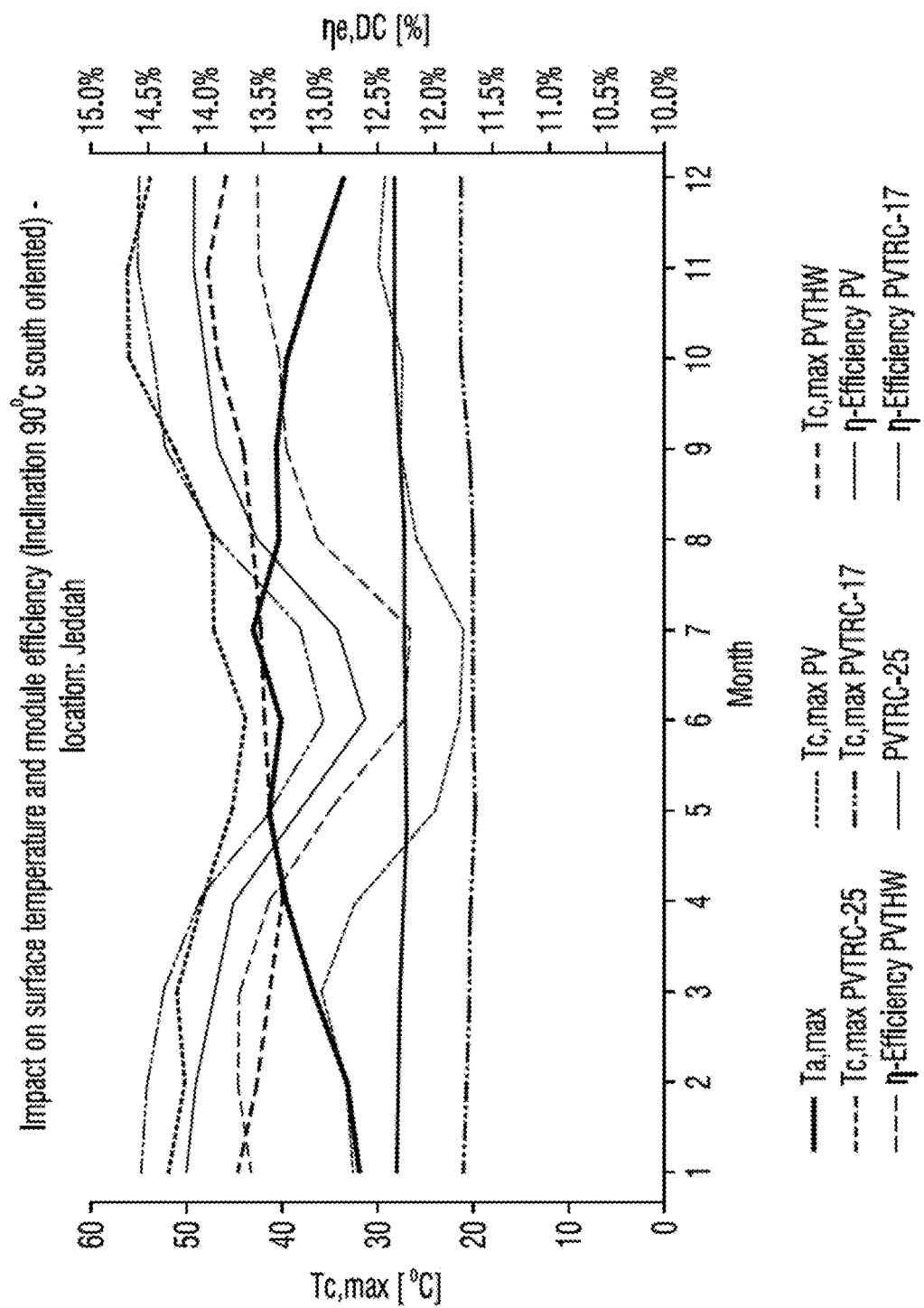
FIG. 18 shows the impact on surface temperature and module efficiency at a 90° inclination south orientation in Jeddah.
Figure 19:
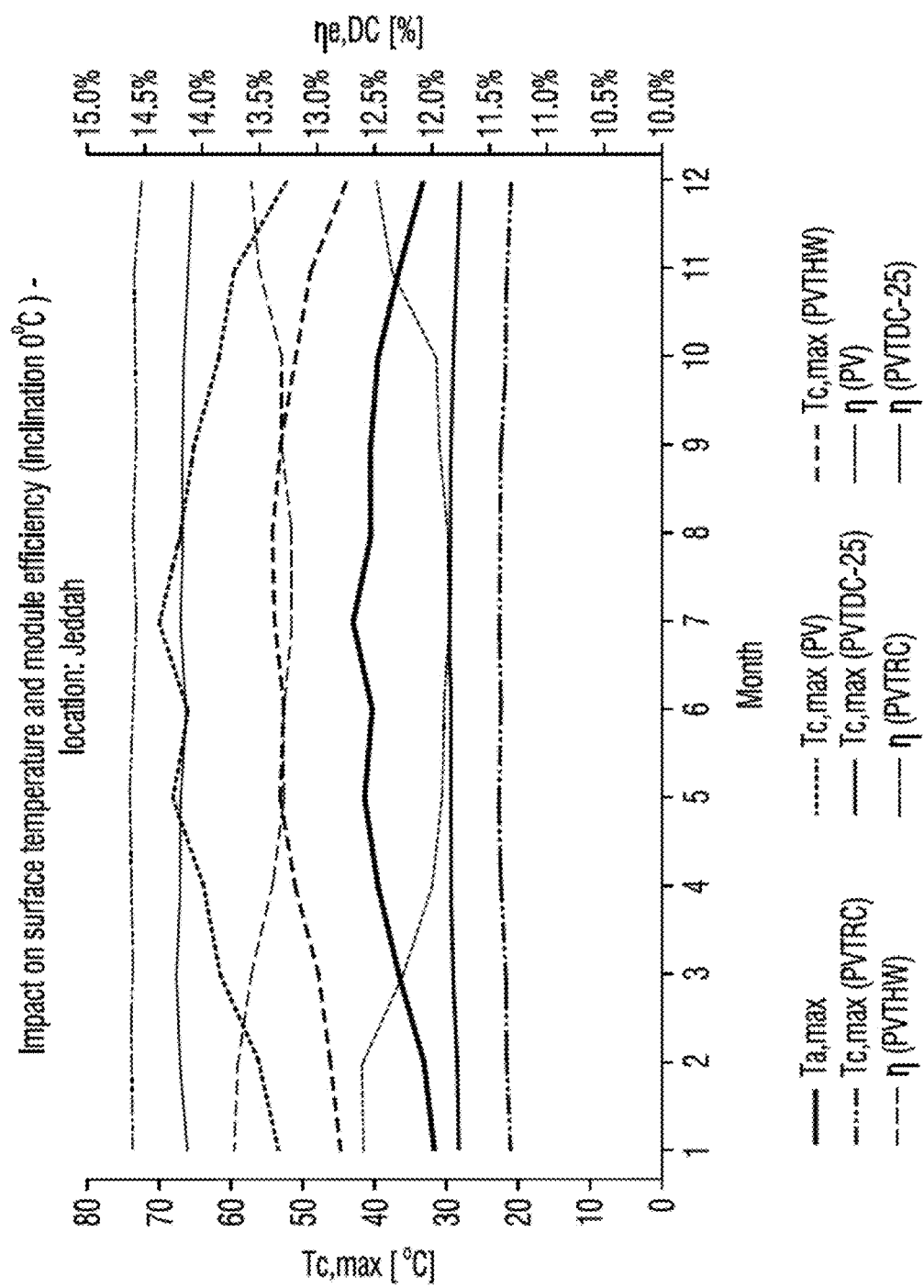
FIG. 19 shows the impact on surface temperature and module efficiency at a 0° inclination south orientation in Jeddah.

FIGS. 18 and 19 depict the impact of the different systems on the Tc and efficiency of the PV. The inlet temperature for these embodiments is 17° C.

In embodiments the PVTRC of the present disclosure provides:

Higher PV efficiency through lower water supply temperature which is supplied through the coupling of PVT with a radiant cooling panel whereby a connection is made via an extra pipe that links the return water to the supply water of the PVT.

Cooler PVT surface temperature.

Practical application for building façade/wall integrated devices as the surface temperature is low.

Space saving by combining radiant cooling panel with PVT in one device in the same portion of the external wall.

As high cooling loads coincide with high façade irradiance cooling energy can be directly generated via electric compressor connected to the PVT. No energy storage is required.

Use with different inclinations, facades and roof forms.

Connectable in series and with varied sizes.

Operable and functional as a window to allow fresh air intake in times of pleasant temperature.

Higher performance achieved using capillary tubes on both panels instead of copper pipes.

The invention claimed is:

1. A building-integrated hybrid photovoltaic and radiant cooling device, comprising:
    a photovoltaic panel;
    a radiant cooling panel;
    a first cooling pipe in direct contact with a back surface of the photovoltaic panel;
    a second cooling pipe in direct contact with a back surface of the radiant cooling panel;
    a connecting pipe fluidly connecting the first and the second cooling pipes;
    a chiller fluidly connected to the first or the second cooling pipe;
    at least one return pipe conveying the fluid from the chiller to the first cooling pipe; and
    a frame configured to separate the photovoltaic panel and the radiant cooling panel and form an enclosed space defined by the frame, the photovoltaic panel and the radiant cooling panel,
    wherein the frame surrounds the edges of the photovoltaic panel and the radiant cooling panel,
    wherein a thermal insulation layer having length and width dimensions substantially the same as the frame is present in the enclosed space between the photovoltaic panel and the radiant cooling panel, and the first cooling pipe, the second cooling pipe and the connecting pipe are present in the enclosed space and wherein a gap is present between the thermal insulating layer and the second cooling pipe.

2. The building-integrated hybrid photovoltaic and radiant cooling device according to claim 1, configured to be employed with a variety of facades and roof forms, and to be mounted at a variety of inclinations.

3. The building-integrated hybrid photovoltaic and radiant cooling system according to claim 1, comprising a plurality of said building-integrated hybrid photovoltaic and radiant cooling devices adapted to be mounted in series with one another.

4. The building-integrated hybrid photovoltaic and radiant cooling device according to claim 1, further comprising an air compressor configured to be supplied with electrical power by the photovoltaic device.

5. The building-integrated hybrid photovoltaic and radiant cooling device according to claim 1, wherein the building-integrated hybrid photovoltaic and radiant cooling device is configured to operate as a window and to selectively open and close.

6. The building-integrated hybrid photovoltaic and radiant cooling device according to claim 1, wherein at least one of the first and the second cooling pipes is comprises a plurality of capillary tubes in direct contact with one of the photovoltaic panel or the a radiant cooling panel.

7. The building-integrated hybrid photovoltaic and radiant cooling device according to claim 1, wherein the radiant cooling panel and the photovoltaic device form a single integrated structure.

8. The building-integrated hybrid photovoltaic and radiant cooling device according to claim 1, further comprising a solar thermal collector.

9. The building-integrated hybrid photovoltaic and radiant cooling device according to claim 1, wherein the chiller is a thermally driven chiller.

10. A hybrid photovoltaic and radiant cooling method utilizing the building-integrated hybrid photovoltaic and radiant cooling device of claim 1, comprising:

supplying a cooling fluid to a radiant cooling panel;

conveying the fluid from the radiant cooling panel to cool a photovoltaic panel separated from the radian cooling panel by a gap along the flat surface of the panels;

transporting the cooling fluid from the photovoltaic panel to the chiller; and reducing a surface temperature of the radiant cooling panel only to the extent necessary to also avoid condensation being formed on the radiant cooling panel.

11. The method according to claim 10, wherein the hybrid photovoltaic and radiant cooling device is configured to be employed with a variety of facades and roof forms, and to be mounted at a variety of inclinations.

12. The method according to claim 10, in which a plurality of hybrid photovoltaic and radiant cooling devices are mounted in series with one another.

13. The method according to claim 10, further comprising:

supplying air compressor with electrical power by the photovoltaic device.

14. The method according to claim 10, further comprising opening and closing a window comprising the photovoltaic device and the radiating panel.

15. The method according to claim 10, wherein the hybrid photovoltaic and radiant cooling device comprises cooling pipes having capillary tubes.

16. The method according to claim 10, wherein the radiant cooling panel and the photovoltaic device form a single integrated structure.

* * * * *